(12) United States Patent
Tanabe et al.

(10) Patent No.: US 9,713,245 B2
(45) Date of Patent: Jul. 18, 2017

(54) WIRED CIRCUIT BOARD

(71) Applicant: NITTO DENKO CORPORATION, Osaka (JP)

(72) Inventors: Hiroyuki Tanabe, Osaka (JP); Yoshito Fujimura, Osaka (JP); Yuu Sugimoto, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/058,502

(22) Filed: Mar. 2, 2016

(65) Prior Publication Data

US 2016/0262258 A1 Sep. 8, 2016

(30) Foreign Application Priority Data

Mar. 3, 2015 (JP) ................................. 2015-041581

(51) Int. Cl.
| | |
|---|---|
| H05K 1/02 | (2006.01) |
| H05K 1/18 | (2006.01) |
| G11B 5/48 | (2006.01) |
| H05K 3/34 | (2006.01) |
| H05K 1/11 | (2006.01) |

(52) U.S. Cl.
CPC ......... *H05K 1/0213* (2013.01); *G11B 5/4853* (2013.01); *H05K 1/181* (2013.01); *H05K 3/341* (2013.01); *H05K 1/118* (2013.01); *H05K 1/18* (2013.01); *H05K 2201/05* (2013.01); *H05K 2203/048* (2013.01)

(58) Field of Classification Search
CPC ................. H05K 1/0213; H05K 3/341; H05K 2203/048; G11B 5/4853
See application file for complete search history.

(56) References Cited

U.S. PATENT DOCUMENTS

| | | | | |
|---|---|---|---|---|
| 6,399,899 | B1 * | 6/2002 | Ohkawa | H01R 13/58 174/255 |
| 6,940,023 | B2 * | 9/2005 | Ishizuka | H05K 1/116 174/260 |
| 7,571,540 | B2 * | 8/2009 | Aonuma | H05K 3/44 174/250 |

(Continued)

FOREIGN PATENT DOCUMENTS

JP 2007-250662 A 9/2007

*Primary Examiner* — Ishwarbhai B Patel
(74) *Attorney, Agent, or Firm* — Edwards Neils LLC; Jean C. Edwards

(57) ABSTRACT

A wired circuit board includes a first insulating layer, a conductive pattern disposed on the first insulating layer and including a plurality of terminals arranged in parallel to be spaced apart from each other, and a second insulating layer disposed on the first insulating layer so as to cover the conductive pattern. Each of the terminals includes a main body portion and a protruding portion protruding from the main body portion and having a dimension in a parallel arrangement direction of the terminals which is shorter than a dimension of the main body portion thereof. The second insulating layer includes a plurality of end-portion covering portions disposed individually on both end portions of the main body portion in the parallel arrangement direction and exposing a middle portion of the main body portion and the protruding portion.

6 Claims, 10 Drawing Sheets

(56) References Cited

U.S. PATENT DOCUMENTS

| | | | |
|---|---|---|---|
| 7,652,890 B2* | 1/2010 | Ohsawa | G11B 5/486 |
| | | | 174/254 |
| 8,471,154 B1* | 6/2013 | Yoshida | H01L 23/3128 |
| | | | 174/260 |
| 2007/0218781 A1 | 9/2007 | Yokai et al. | |

* cited by examiner

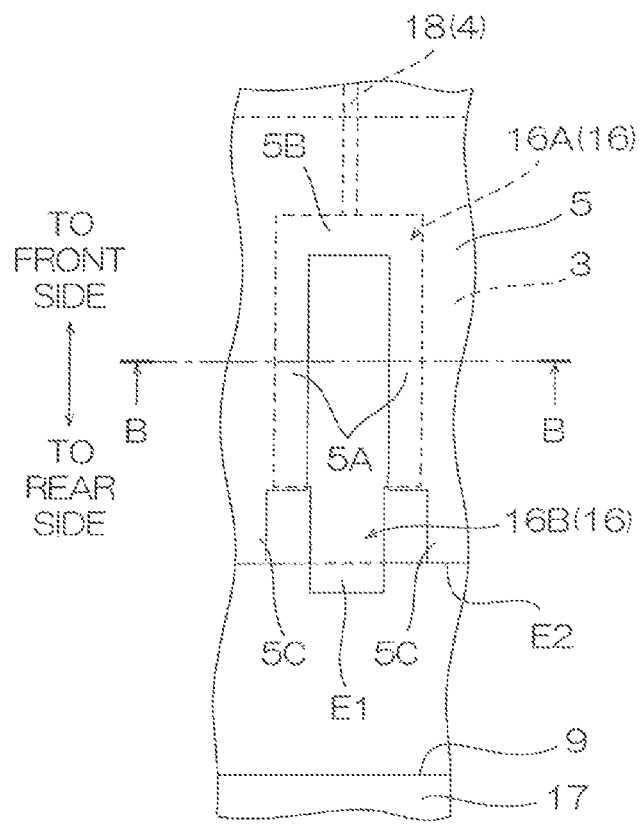

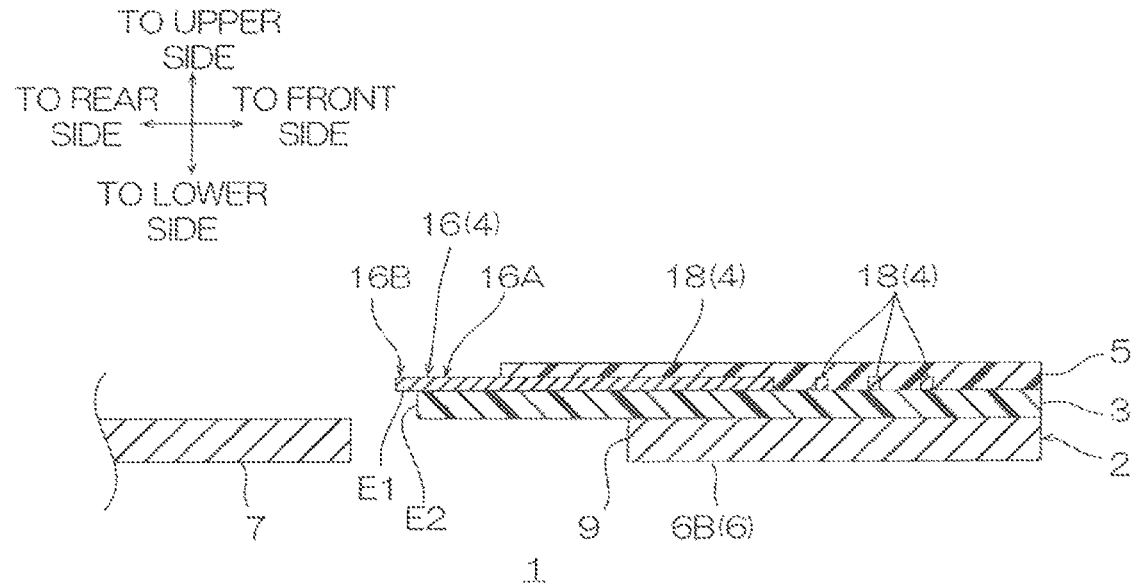
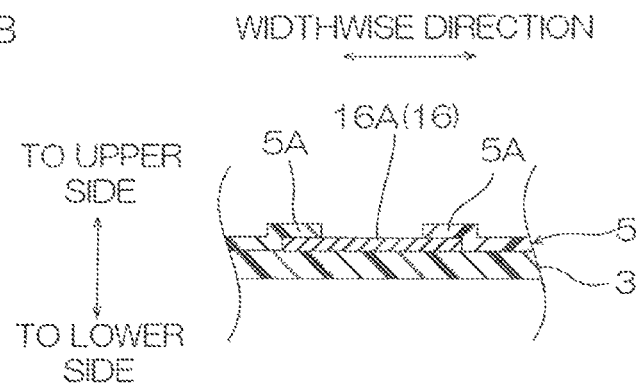

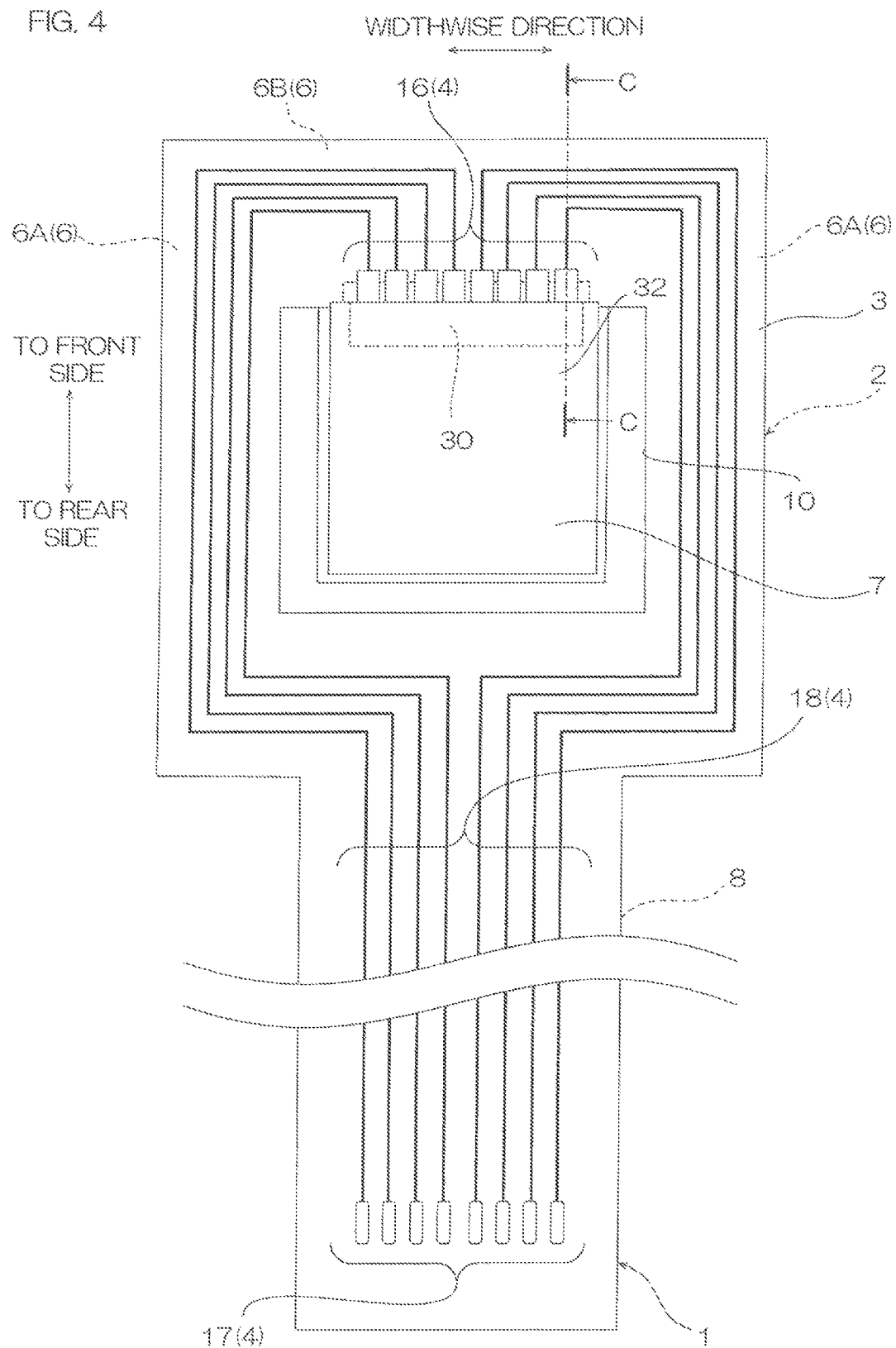

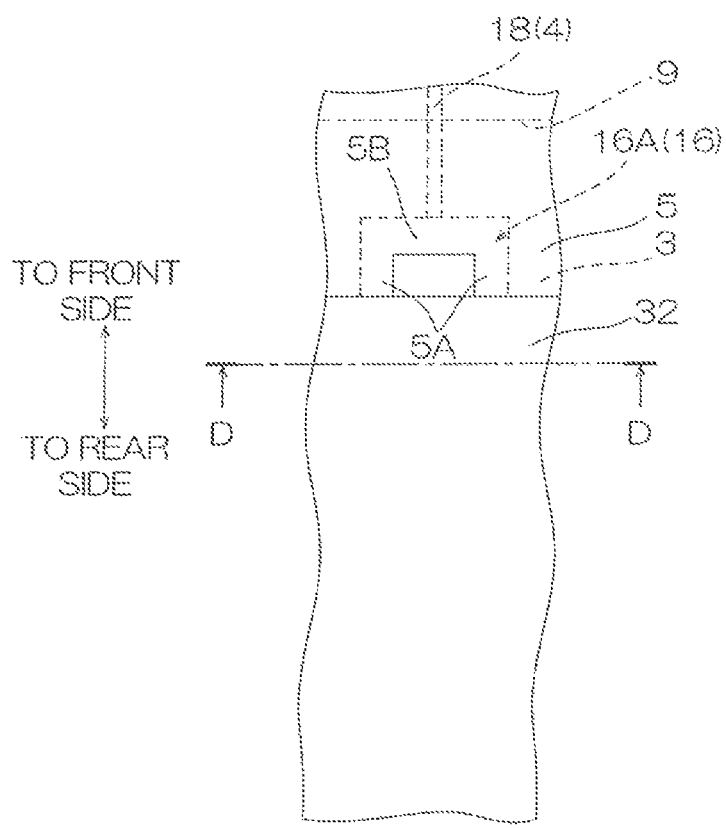

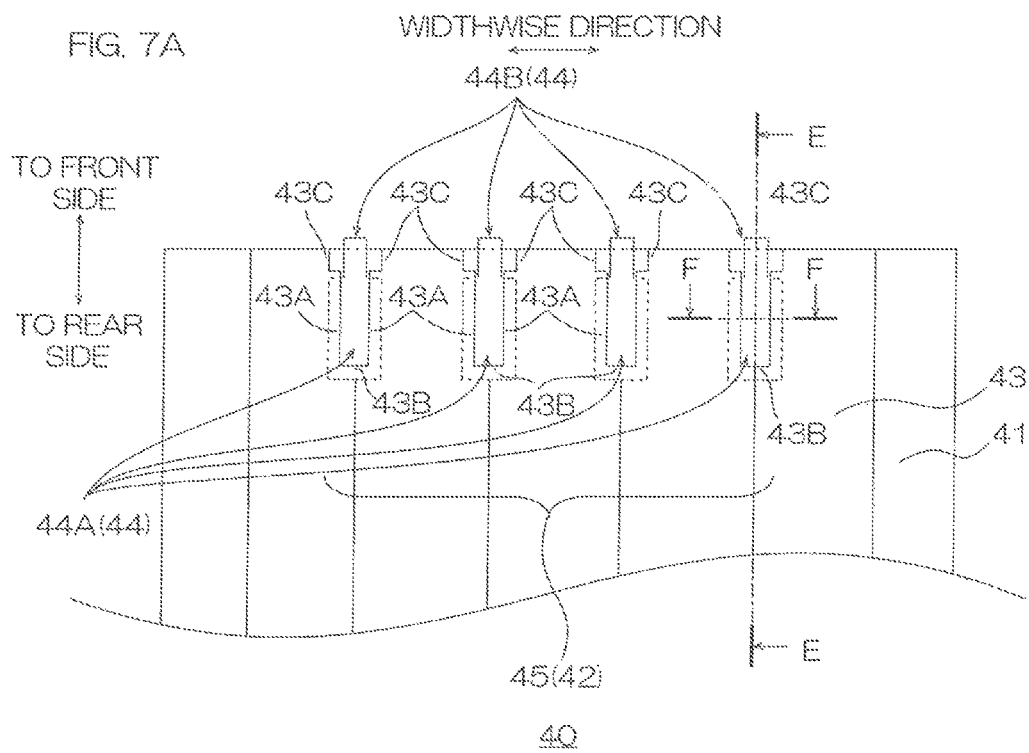
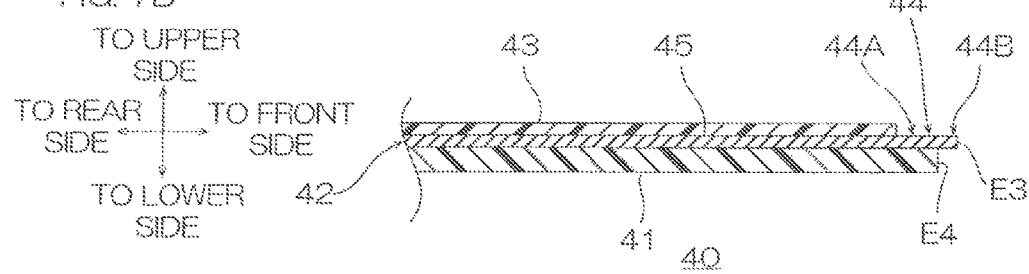
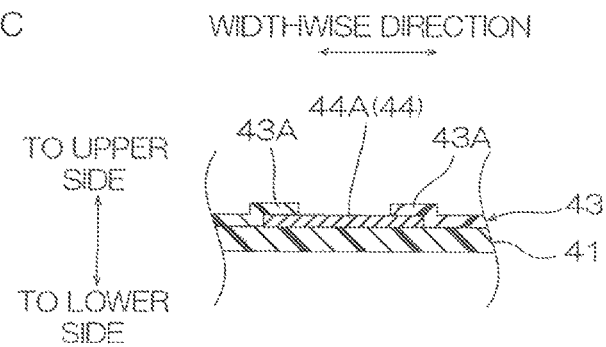

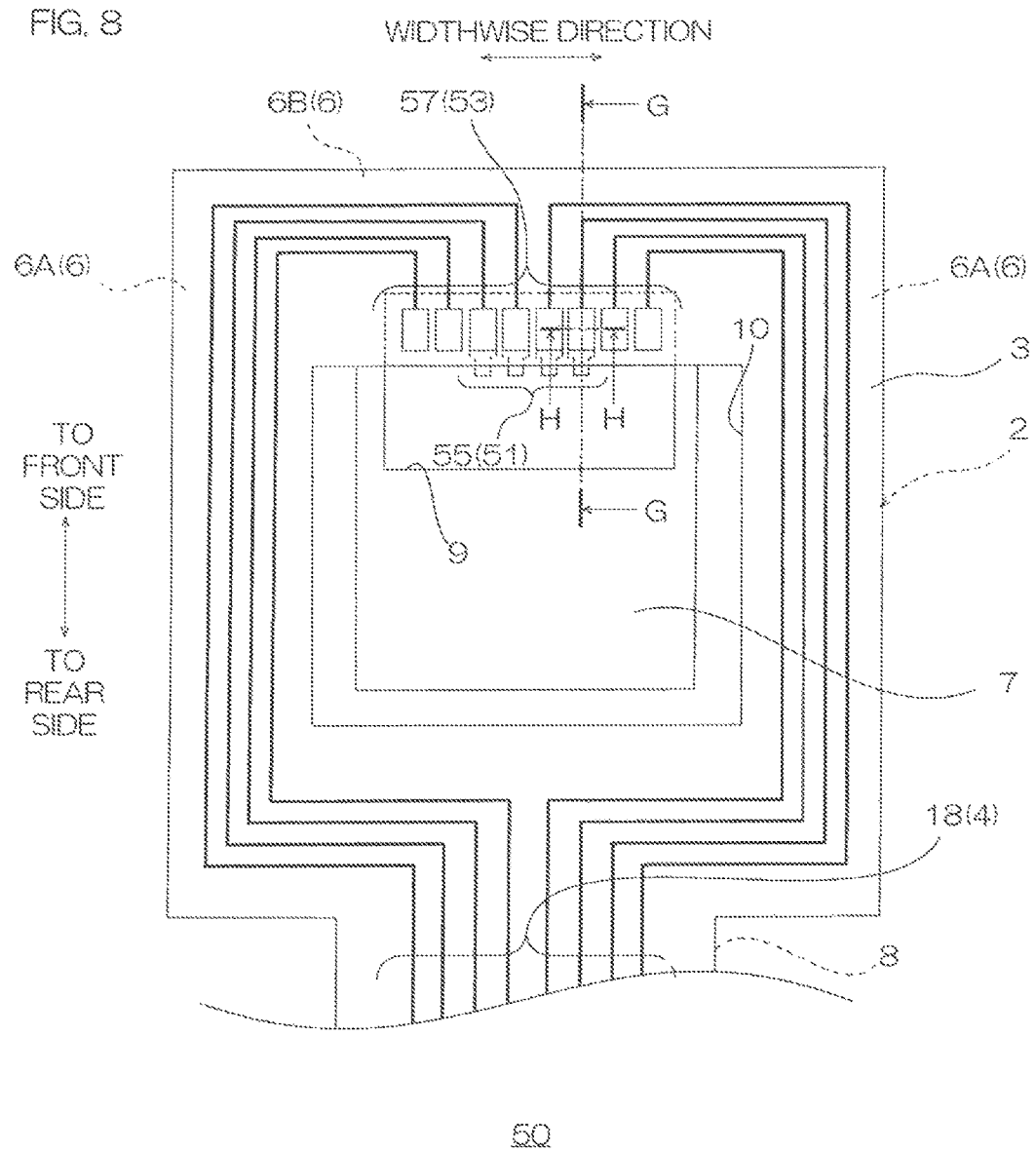

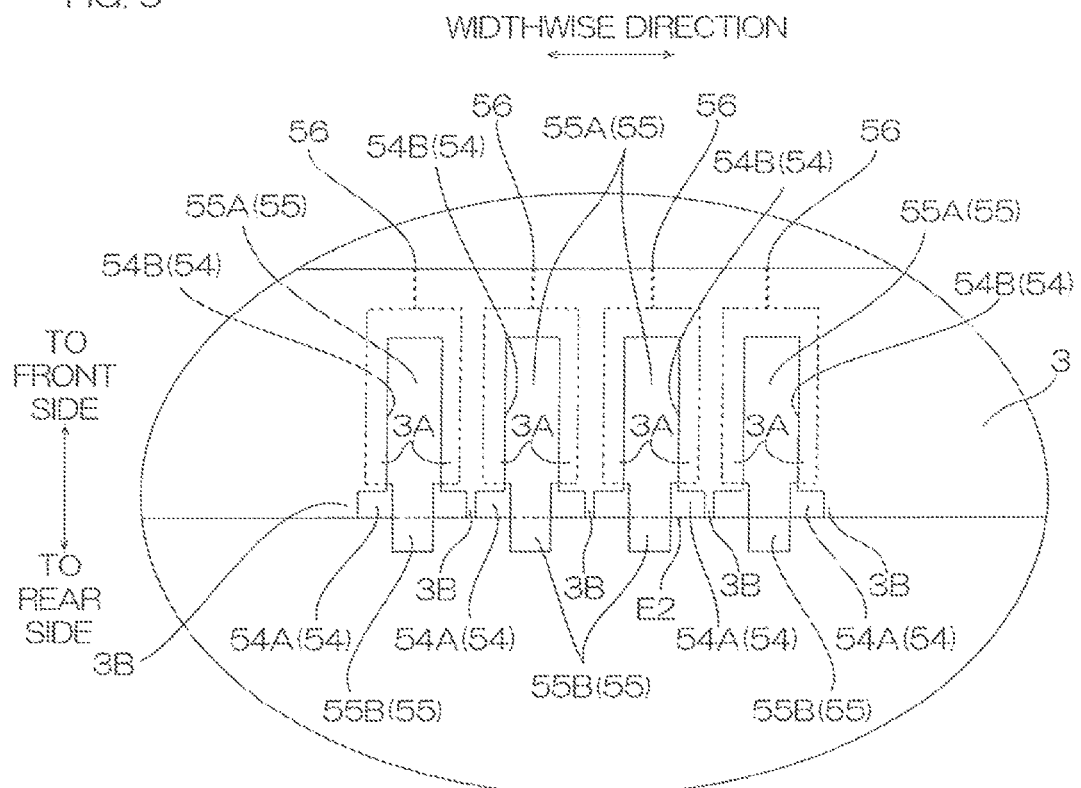

WIRED CIRCUIT BOARD

CROSS-REFERENCE TO RELATED APPLICATION

The present application claims priority from Japanese Patent Application No. 2015-041581 filed on Mar. 3, 2015, the content of which is herein incorporated by reference into this application.

BACKGROUND OF THE INVENTION

Field of the Invention

The present invention relates to a wired circuit board such as a suspension board with circuit.

Description of the Related Art

Conventionally, a wired circuit board including an insulating base layer and a conductive pattern formed on the insulating base layer has been known.

As an example of such a wired circuit board, a suspension board with circuit has been known which includes a conductive pattern having a connection terminal portion to be connected to an external wired circuit board and a magnetic-head-side terminal portion to be connected to a magnetic head.

In the suspension board with circuit, the connection terminal portion is connected to the external wired circuit board using a solder (see, e.g., Japanese Unexamined Patent No. 2007-250662).

SUMMARY OF THE INVENTION

In a wired circuit board such as the suspension board with circuit described in Japanese Unexamined Patent No. 2007-250662, when terminal portions are to be arranged at a finer pitch, the spaces between the terminal portions adjacent to each other are reduced.

As a result, when the suspension board with circuit is connected to the external wired circuit board, the excessive part of the melted solder may spread over to the adjacent terminal portion to possibly cause a short circuit between the terminal portions adjacent to each other.

It is therefore an object of the present invention to provide a wired circuit board which can allow terminals to be arranged at a finer pitch and also prevent a short circuit between the terminals adjacent to each other.

The present invention (1) involves a wired circuit board including a first insulating layer, a conductive pattern disposed on the first insulating layer and including a plurality of terminals arranged in parallel to be spaced apart from each other and a plurality of wires continued individually to the plurality of terminals, and a second insulating layer disposed on the first insulating layer so as to cover the conductive pattern. Each of the plurality of terminals includes a main body portion continued to the corresponding wire, and a protruding portion protruding from the main body portion and having a dimension in a parallel arrangement direction in which the plurality of terminals are arranged in parallel which is shorter than a dimension of the main body portion in the parallel arrangement direction. The second insulating layer includes a plurality of end-portion covering portions disposed individually on both end portions of the main body portion in the parallel arrangement direction and exposing a middle portion of the main body portion in the parallel arrangement direction and the protruding portion.

In such a configuration, the second insulating layer includes the plurality of end-portion covering portions disposed individually on the both end portions of the main body portion in the parallel arrangement direction.

As a result, when a solder is melted over the main body portion, the end-portion covering portions restrict the flow of the excessive solder in the parallel arrangement direction. Consequently, the excessive solder flows toward the protruding portion and then flows downward into the space under the protruding portion to adhere to the side surfaces of the protruding portion in the parallel arrangement direction and to the lower surface thereof.

This can suppress the spreading of the excessive solder over the insulating base layer toward the adjacent terminal and adhering to the adjacent terminal.

In addition, since a space larger than the space between the main body portions is ensured between the protruding portions, it is possible to more reliably suppress the adherence of the excessive solder to the adjacent terminal.

As a result, it is possible to reduce the space between the main body portions to provide a finer pitch and also prevent a short circuit between the terminals adjacent to each other.

The present invention (2) involves a wire circuit board as described in (1) above in which the dimension of the protruding portion in the parallel arrangement direction is not more than a space in the parallel arrangement direction between the plurality of end-portion covering portions.

In such a configuration, the dimension of the protruding portion in the parallel arrangement direction is the same as or smaller than the space in the parallel arrangement direction between the end-portion covering portions.

This allows the excessive solder that has flown from the main body portion to the protruding portion to smoothly flow outwardly from the protruding portion in the parallel arrangement direction.

The present invention (3) involves a wire circuit board as described in (1) or (2) above in which, in a protruding direction of the protruding portion, a dimension of each of the end-portion covering portions is larger than a dimension of the protruding portion.

In such a configuration, the dimension of the main body portion exposed from the second insulating layer in the protruding direction is larger than the dimension of the protruding portion in the protruding direction.

This allows the solder melted over the main body portion to reliably stay over the main body portion.

The present invention (4) involves a wire circuit board as described in any one of (1) to (3) above in which the second insulating layer further includes a plurality of facing portions arranged externally in the parallel arrangement direction of both end portions of the protruding portion in the parallel arrangement direction to be spaced apart from each other.

In such a configuration, it is possible to allow the excessive solder to flow outwardly from the protruding portion in the parallel arrangement direction and also restrict the solder that has flown outwardly from the protruding portion in the parallel arrangement direction using the facing portions.

As a result, it is possible to receive the excessive solder between the protruding portion and the facing portions and also reliably suppress the flow of the excessive solder to the adjacent terminal using the facing portions.

The present invention (5) involves a wire circuit board as described in (4) above in which a space in the parallel arrangement direction between the plurality of facing portions is larger than a space in the parallel arrangement direction between the plurality of end-portion covering portions.

In such a configuration, the space in the parallel arrangement direction between the facing portions is larger than the space in the parallel arrangement direction between the end-portion covering portions.

This allows the excessive solder to be reliably received between the protruding portion and the facing portions.

The present invention (6) involves a wire circuit board as described in any one of (1) to (5) above in which a downstream end portion of the protruding portion in a protruding direction thereof protrudes from the first insulating layer.

Such a configuration can allow the excessive solder to adhere to the side surfaces in the parallel arrangement direction of the downstream end portion of the protruding portion in the protruding direction and to the lower surface thereof and thus suppress the flow of the excessive solder to the adjacent terminal.

BRIEF DESCRIPTION OF THE DRAWINGS

FIG. 2 is an enlarged main-portion view of the suspension board with circuit shown in FIG. 1;

FIG. 3A is a cross-sectional view of the suspension board with circuit shown in FIG. 1 along the line A-A;

FIG. 3B is a cross-sectional view of the suspension board with circuit shown in FIG. 2 along the line B-B;

FIG. 4 is a plan view showing a state in which a slider is mounted on the suspension board with circuit shown in FIG. 1;

FIG. 5 is an enlarged main-portion view of the suspension board with circuit shown in FIG. 4;

FIG. 7A is a plan view showing a flexible wired circuit board as a second embodiment of the wired circuit board of the present invention;

FIG. 7B is a cross-sectional view of the flexible wired circuit board shown in FIG. 7A along the line E-E;

FIG. 7C is a cross-sectional view of the flexible wired circuit board shown in FIG. 7A along the line F-F;

FIG. 8 is a plan view showing a suspension board with circuit as a third embodiment of the wired circuit board of the present invention;

FIG. 9 is a bottom view of the light source connection terminals shown in FIG. 8;

DETAILED DESCRIPTION OF THE INVENTION

First Embodiment

Figure 1:
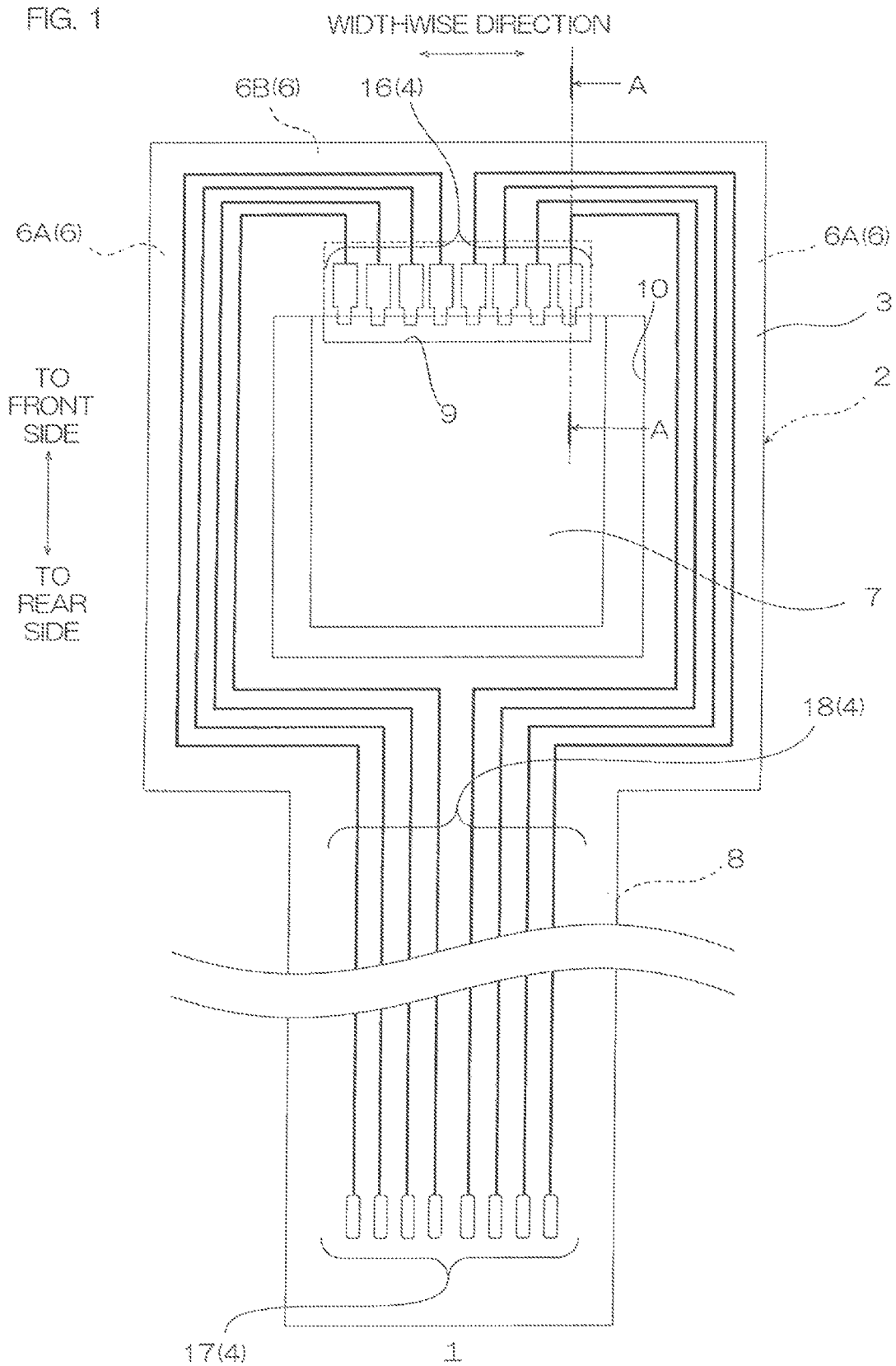
FIG. 1 is a plan view showing a suspension board with circuit as a first embodiment of a wired circuit board of the present invention.

As shown in FIG. 1, a suspension board with circuit 1 is formed in a flat belt shape extending in an upper-lower direction along the surface of the paper sheet with FIG. 1.

In the following description, when directions associated with the suspension board with circuit 1 are mentioned, it is assumed that the upper-lower direction along the surface of the paper sheet with FIG. 1 is a front-rear direction and a widthwise direction along the surface of the paper sheet with FIG. 1 is a widthwise direction as an example of a parallel arrangement direction. The upper side of the surface of the paper sheet with FIG. 1 corresponds to a front side and the lower side of the surface of the paper sheet with FIG. 1 corresponds to a rear side. It is also assumed that an upper-lower direction along the surface of the paper sheet with FIG. 3A is an upper-lower direction (thickness direction). The upper side of the paper sheet with FIG. 3A corresponds to an upper side (one side in the thickness direction) and the lower side of the paper sheet with FIG. 3A corresponds to a lower side (the other side in the thickness direction). In FIGS. 1 and 4, for improved clarity of illustration of a configuration of a conductive pattern 4, an insulating cover layer 5 is omitted.

As shown in FIGS. 1 and 3A, the suspension board with circuit 1 includes a metal supporting board 2, an insulating base layer 3 as an example of a first insulating layer, the conductive pattern 4, and the insulating cover layer 5 as an example of a second insulating layer.

The metal supporting board 2 has a flat-belt shape extending in the front-rear direction so as to form the outer shape of the suspension board with circuit 1. The metal supporting board 2 integrally includes a support frame portion 6, a tongue portion 7, an opening 9, and a wire supporting portion 8.

The support frame portion 6 is disposed in the front end portion of the metal supporting board 2. The support frame portion 6 has a generally rectangular frame shape in plan view. Specifically, the support frame portion 6 includes a plurality of (two) outrigger portions 6A and a bridge portion 6B.

The plurality of (two) outrigger portions 6A are disposed in the both widthwise end portions of the support frame portion 6. Each of the plurality of (two) outrigger portions 6A has a generally flat plate shape extending in the front-rear direction. The respective rear end portions of the plurality of (two) outrigger portions 6A are continued to the both widthwise end portions of the front end portion of the wire supporting portion 8.

The bridge portion 6B is disposed in the front end portion of the support frame portion 6. The bridge portion 6B has a generally flat plate shape extending in a widthwise direction. The both widthwise end portions of the bridge portion 6B are continued to the respective front end portions of the plurality of (two) outrigger portions 6A.

The tongue portion 7 is disposed inwardly of the support frame portion 6 such that the both widthwise end edges and the rear end edge thereof are spaced apart from the inner peripheral edge of the support frame portion 6. The tongue portion 7 has a generally rectangular flat plate shape in plan view so as to extend continuously rearwardly from the rear end edge of the bridge portion 6B. As a result, between the tongue portion 7 and the support frame portion 6, a generally U-shaped through portion 10 which is open to the front side is defined.

The opening 9 is disposed in the boundary portion between the bridge portion 6B and the tongue portion 7. The opening 9 has a generally rectangular shape in plan view extending in the widthwise direction. The opening 9 extends through the metal supporting board 2 in the thickness direction. The about three-quarter front part of the opening 9 is disposed in the rear end portion of the bridge portion 6B.

The about one-quarter rear part of the opening 9 is disposed in the front end portion of the tongue portion 7.

The wire supporting portion 8 has a flat belt shape extending continuously rearwardly from the rear end portion of the support frame portion 6.

The insulating base layer 3 is provided on the upper surface of the metal supporting board 2 so as to expose the tongue portion 7 and cover the support frame portion 6 and the wire supporting portion 8. Consequently, the insulating base layer 3 covers the about three-quarter front part of the opening 9 and exposes the about one-quarter rear part of the opening 9.

The conductive pattern 4 is formed on the upper surface of the insulating base layer 3. The conductive pattern 4 includes a plurality of (eight) magnetic head connection terminals 16 as an example of terminals, a plurality of (eight) external connection terminals 17, and a plurality of (eight) wires 18.

As shown in FIGS. 1 and 2, each of the plurality of magnetic head connection terminals 16 is disposed on the upper surface of the insulating base layer 3 so as to overlap the opening 9 in plan view. The plurality of magnetic head connection terminals 16 are arranged in parallel to be spaced apart from each other in the widthwise direction. Each of the plurality of magnetic head connection terminals 16 includes a main body portion 16A and a protruding portion 16B.

The main body portion 16A is formed on the upper surface of the insulating base layer 3 overlapping the opening 9. The main body portion 16A has a generally rectangular shape (quadrilateral land shape) extending in the front-rear direction.

The protruding portion 16B is disposed in the rear end portion of the magnetic head connection terminal 16. The protruding portion 16B protrudes continuously in a rearward direction from the widthwise middle of the rear end portion of the main body portion 16A. Note that "the rearward direction" is an example of a protruding direction. The protruding portion 16B has a generally rectangular shape in plan view having a width smaller than that of the main body portion 16A. A rear end portion E1 of the protruding portion 16B protrudes rearwardly from a rear end edge E2 of the insulating base layer 3 over the opening 9. As a result, in bottom view, the rear end portion E1 of the protruding portion 16B is exposed from the insulating base layer 3.

As shown in FIG. 1, each of the plurality of external connection terminals 17 is connected to an external control board (not shown) or the like. Depending on a configuration of the external control board (not shown), the shape and location of the external connection terminal 17 and a method of bonding the external connection terminal 17 can optionally be selected. Specifically, in the present embodiment, each of the plurality of external connection terminals 17 is disposed on the rear end portion of the wire supporting portion 8. Each of the plurality of external connection terminals 17 has a generally rectangular shape in plan view. The plurality of external connection terminals 17 are arranged in parallel to be spaced apart from each other in the widthwise direction.

The plurality of wires 18 are formed in mutually spaced-apart relation to extend from the respective front end portions of the corresponding magnetic head connection terminals 16 over the support frame portion 6 and the wire supporting portion 8 and be continued to the external connection terminals 17.

As shown in FIGS. 2 and 3B, the insulating cover layer 5 is formed on the upper surface of the insulating base layer 3 so as to cover the peripheral edge portions of the main body portions 16A of the magnetic head connection terminals 16 and the wires 18. The insulating cover layer 5 exposes the center portions of the main body portions 16A of the magnetic head connection terminals 16, the protruding portions 16B of the magnetic head connection terminals 16, and the external connection terminals 17.

Specifically, the insulating cover layer 5 includes, for each one of the magnetic head connection terminals 16, a plurality of (two) first covering portions 5A as an example of end-portion covering portions, a second covering portion 5B, and a plurality of (two) facing portions 5C.

The plurality of first covering portions 5A individually overlap the both widthwise end portions of the main body portion 16A of each of the magnetic head connection terminals 16. Each of the plurality of first covering portions 5A extends in the front-rear direction and has a generally rectangular shape in plan view.

The second covering portion 5B overlaps the front end portion of the main body portion 16A of the magnetic head connection terminal 16. The second covering portion 5B extends in the widthwise direction and has a generally rectangular shape in plan view. The both widthwise end portions of the second covering portion 5B are continued to the respective front end portions of the plurality of first covering portions 5A.

The plurality of facing portions 5C are arranged on both widthwise outer sides of the protruding portion 16B of the magnetic head connection terminal 16 to be spaced apart from each other. The plurality of facing portions 5C are continued from the respective widthwise outer end portions of the rear end portions of the first covering portions 5A to extend in the front-rear direction. Each of the plurality of facing portions 5C has a generally rectangular shape in plan view.

Next, a method of producing the suspension board with circuit 1 is described with reference to FIGS. 1 to 3A.

To produce the suspension board with circuit 1, first, the metal supporting board 2 is prepared.

Examples of a material for forming the metal supporting board 2 include metal materials such as stainless steel, a 42-alloy, aluminum, a copper-beryllium alloy, and phosphor bronze. Preferably, stainless steel is used.

The thickness of the metal supporting board 2 is in a range of, e.g., not less than 15 μm and, e.g., not more than 50 μm, or preferably not more than 30 μm.

Next, to the upper surface of the metal supporting board 2, a varnish of a photosensitive insulating material is applied, dried, exposed to light, developed, and cured by heating to form the insulating base layer 3 in the pattern described above.

Examples of an insulating material for forming the insulating base layer 3 include insulating materials such as synthetic resins such as a polyimide resin, a polyamide imide resin, an acrylic resin, a polyether nitrile resin, a polyether sulfone resin, a polyethylene terephthalate resin, a polyethylene naphthalate resin, and a polyvinyl chloride resin. Preferably, a polyimide resin is used.

The thickness of the insulating base layer 3 is in a range of, e.g., not less than 1 μm, or preferably not less than 3 μm and, e.g., not more than 35 μm, or preferably not more than 15 μm.

Next, on the upper surface of the insulating base layer 3, the conductive pattern 4 is formed by an additive method, a subtractive method, or the like.

Examples of a material for forming the conductive pattern 4 include conductive materials such as copper, nickel, gold, a solder, and an alloy thereof. Preferably, copper is used.

The thickness of the conductive pattern 4 is in a range of, e.g., not less than 3 μm, or preferably not less than 5 μm and, e.g., not more than 50 μm, or preferably not more than 20 μm.

The width of each of the wires 18 is in a range of, e.g., not less than 5 μm, or preferably not less than 8 μm and, e.g., not more than 200 μm, or preferably not more than 100 μm.

The widthwise space between the wires 18 is in a range of, e.g., not less than 5 μm, or preferably not less than 8 μm and, e.g., not more than 1000 μm, or preferably not more than 100 μm.

The width of the main body portion 16A of each of the magnetic head connection terminals 16 is in a range of, e.g., not less than 15 μm, or preferably not less than 20 μm and, e.g., not more than 1000 μm, or preferably not more than 800 μm.

The space between the main body portions 16A of the magnetic head connection terminals 16 is in a range of, e.g., not less than 15 μm, or preferably not less than 20 μm and, e.g., not more than 1000 μm, or preferably not more than 800 μm.

The width of the protruding portion 16B of each of the magnetic head connection terminals 16 is shorter than the width of the main body portion 16A thereof and is in a range of, e.g., not less than 7 μm, or preferably not less than 10 μm and, e.g., not more than 500 μm, or preferably not more than 400 μm. When the width of the main body portion 16A is defined to be 100%, the width of the protruding portion 16B of the magnetic head connection terminal 16 is in a range of, e.g., not more than 95%, or preferably not more than 90% and, e.g., not less than 20%.

The space between the protruding portions 16B of the magnetic head connection terminals 16 is wider than the space between the main body portions 16A and in a range of, e.g., not less than 20 μm, or preferably not less than 30 μm and, e.g., not more than 1200 μm, or preferably not more than 1000 μm. When the space between the main body portions 16A is defined to be 100%, the space between the protruding portions 16B of the magnetic head connection terminals 16 is in a range of, e.g., more than 100%, or preferably not less than 105% and, e.g., not more than 200%.

The width of each of the external connection terminals 17 is in a range of, e.g., not less than 15 μm, or preferably not less than 20 μm and, e.g., not more than 1000 μm, or preferably not more than 800 μm.

The space between the external connection terminals 17 is in a range of, e.g., not less than 15 μm, or preferably not less than 20 μm and, e.g., not more than 1000 μm, or preferably not more than 800 μm.

Next, to the upper surface of the insulating base layer 3, a varnish of a photosensitive insulating material is applied so as to cover the conductive pattern 4, dried, exposed to light, developed, and cured by heating to form the insulating cover layer 5 in the pattern described above.

As a material for forming the insulating cover layer 5, the same insulating material as the insulating material of the insulating base layer 3 shown above can be used. The thickness of the insulating cover layer 5 (first covering portion 5A) is in a range of, e.g., not less than 1 μm and, e.g., not more than 40 μm, or preferably not more than 10 μm.

The widthwise space between the first covering portions 5A is, e.g., not less than the width of each of the protruding portions 16B of the magnetic head connection terminals 16 and in a range of, e.g., not less than 7 μm, or preferably not less than 10 μm and, e.g., not more than 500 μm, or preferably not more than 400 μm.

The width (dimension in the widthwise direction) of each of the first covering portions 5A is in a range of, e.g., not less than 4 μm, or preferably not less than 5 μm and, e.g., not more than 250 μm, or preferably not more than 200 μm.

The percentage of each of the first covering portions 5A to the width of each of the main body portions 16A is in a range of, e.g., not less than 10%, or preferably not less than 15% and, e.g., not more than 70%.

The width (dimension in the front-rear direction) of the second covering portion 5B is in a range of, e.g., not less than 4 μm, or preferably not less than 5 μm and, e.g., not more than 250 μm, or preferably not more than 200 μm.

The percentage of the width of the second covering portion 5B to the dimension of the main body portion 16A in the front-rear direction is in a range of, e.g., not less than 5%, or preferably not less than 10% and, e.g., not more than 70%.

The widthwise space between the facing portions 5C is substantially the same as the width (dimension in the widthwise direction) of the main body portion 16A and not less than the widthwise space between the first covering portions 5A. The widthwise space between the facing portions 5C is in a range of, e.g., not less than 15 μm, or preferably not less than 20 μm and, e.g., not more than 1000 μm, or preferably not more than 800 μm.

The widthwise distance between each of the facing portions 5C and the protruding portion 16B is in a range of, e.g., not less than 4 μm, or preferably not less than 5 μm and, e.g., not more than 250 μm, or preferably not more than 200 μm.

The percentage of the widthwise distance between the facing portion 5C and the protruding portion 16B to the width of the protruding portion 16B is in a range of, e.g., not less than 10%, or preferably not less than 20% and, e.g., not more than 100%, or preferably not more than 80%.

Next, the metal supporting board 2 is processed into the outer shape described above. At this time, the opening 9 and the through portion 10 are formed.

To process the metal supporting board 2, an etching method such as, e.g., dry etching (e.g., plasma etching) or wet etching (e.g., chemical etching) or a method such as, e.g., drilling perforation or laser processing is used. Preferably, the metal supporting board 2 is processed by an etching method.

In this manner, the suspension board with circuit 1 is completed.

Figure 6A:
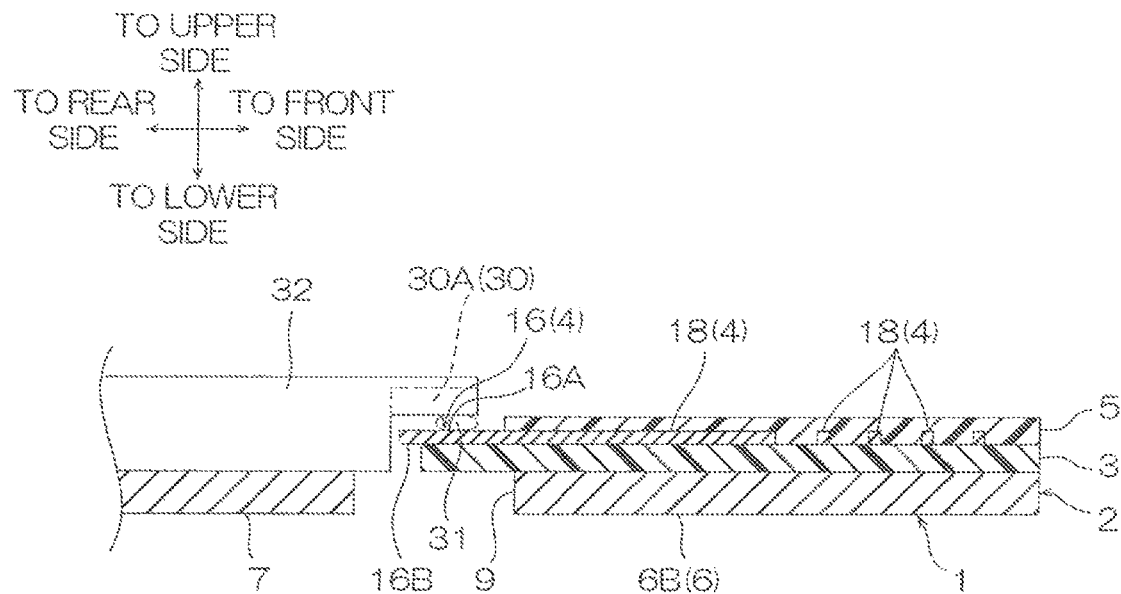
FIG. 6A is a cross sectional view of the suspension board with circuit shown in FIG. 4 along the line C-C.
Figure 6B:
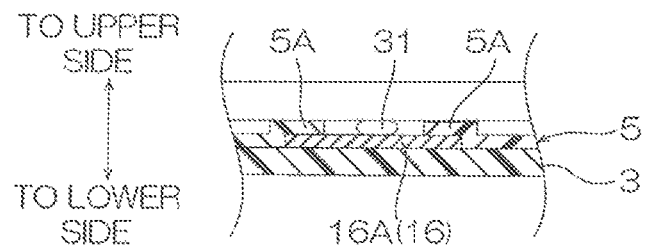
FIG. 6B is a cross-sectional view of the suspension board with circuit shown in FIG. 5 along the line D-D.

Next, the mounting of a slider 32 on the suspension board with circuit 1 is described with reference to FIGS. 4 to 6.

The slider 32 has a generally rectangular shape in plan view and has a magnetic head 30 at the front end portion thereof.

To mount the slider 32, first, solder balls 31 are formed on the upper surfaces of the main body portions 16A of the magnetic head connection terminals 16.

Next, the slider 32 is bonded to the tongue portion 7 via an adhesive such that terminals 30A of the magnetic head 30 come in contact with the solder balls 31. At this time, the slider 32 is placed so as to expose the front end portions of the magnetic head connection terminals 16 in plan view.

Next, the solder balls 31 are melted.

As a result, the melted solder is crushed between the terminals 30A of the magnetic head 30 and the main body portions 16A to spread over the upper surfaces of the main body portions 16A.

At this time, when the solder balls 31 are excessively large, an excessive solder may occur. The further flow of the excessive solder in the widthwise direction is suppressed by the first covering portions 5A of the insulating cover layer 5A to flow from over the upper surfaces of the main body portions 16A to over the upper surfaces of the protruding portions 16B.

Consequently, the excessive solder spreads over the upper surfaces of the protruding portions 16B to flow between the protruding portions 16B and the facing portions 5C (see FIG. 2) and to the rear end portions of the protruding portions 16B.

Note that the solder that has flown to the rear end portions of the protruding portions 16B flows downward into the spaces under the protruding portions 16B to adhere to the widthwise outer surfaces of the protruding portions 16B and to the lower surfaces thereof.

Then, the melted solder cools to be solidified so that the terminals 30A of the magnetic head 30 are bonded to the magnetic head connection terminals 16 via the solder.

In the suspension board with circuit 1, as shown in FIG. 2, the insulating cover layer 5 includes the two first covering portions 5A which are disposed individually on the both widthwise end portions of each of the main body portions 16A.

As a result, when the solder is melted over the main body portion 16A, the flow of the excessive solder in the widthwise direction is suppressed by the first covering portions 5A to flow toward the protruding portion 16B and then flow widthwise outwardly and rearwardly from the protruding portion 16B.

The solder that has flown widthwise outwardly from the protruding portion 16B is received between the protruding portion 16B and the facing portions 5C.

On the other hand, the solder that has flown rearwardly from the protruding portion 16B adheres to the widthwise side surfaces of the rear end portion E1 of the protruding portion 16B and to the lower surface thereof.

Thus, it is possible to suppress the spreading of the excessive solder over the insulating base layer 3 toward the adjacent magnetic head connection terminal 16 and adhering to the adjacent magnetic head connection terminal 16.

In addition, since a space larger than the space between the main body portions 16A is ensured between the protruding portions 16B, it is possible to more reliably suppress the adherence of the excessive solder to the adjacent magnetic head connection terminal 16.

As a result, it is possible to reduce the space between the main body portions 16A to provide a finer pitch and prevent a short circuit between the magnetic head connection terminals 16 adjacent to each other.

In the suspension board with circuit 1, as shown in FIG. 2, the widthwise dimension of the protruding portion 16B is substantially the same as the widthwise space between the first covering portions 5A.

This allows the solder that has flown from the main body portion 16A to the protruding portion 16B to smoothly flow widthwise outwardly from the protruding portion 16B.

Also, in the suspension board with circuit 1, as shown in FIG. 2, the dimension of each of the main body portions 16A exposed from the insulating cover layer 5 in the front-rear direction is larger than the dimension of the protruding portion 16B in the front-rear direction.

Accordingly, it is possible to allow the solder melted over the main body portion 16A to reliably stay over the main body portion 16A.

Also, in the suspension board with circuit 1, as shown in FIG. 2, the insulating cover layer 5 further includes the facing portions 5C arranged widthwise externally of the both widthwise end portions of the protruding portion 16B to be spaced apart from each other.

Accordingly, it is possible to allow the excessive solder to flow widthwise outwardly from the protruding portion 16B and also restrict the solder that has flown widthwise outwardly from the protruding portion 16B using the facing portions 5C.

As a result, it is possible to receive the excessive solder between the protruding portion 16B and the facing portions 5C and also reliably suppress the flow of the excessive solder to the adjacent magnetic head connection terminal 16 using the facing portions 5C.

Also, in the suspension board with circuit 1, as shown in FIG. 2, the widthwise space between the facing portions 5C is larger than the widthwise space between the first covering portions 5A.

This allows the excessive solder to be reliably received between the protruding portion 16B and the facing portions 5C.

Also, in the suspension board with circuit 1, as shown in FIG. 3A, the rear end portion E1 of the protruding portion 16B protrudes from the insulating base layer 3.

Accordingly, it is possible to allow the excessive solder to adhere to the widthwise side surfaces of the rear end portion E1 of the protruding portion 16B and to the lower surface thereof and thus suppress the flow of the excessive solder to the adjacent magnetic head connection terminal 16.

Second Embodiment

In the first embodiment described above, as the wired circuit board, the suspension board with circuit 1 is used. However, as the wired circuit board, a flexible wired circuit board 40 can also be used, as shown in FIGS. 7A, 7B, and 7C.

The flexible wired circuit board 40 has a generally flat belt shape extending in the front-rear direction. The flexible wired circuit board 40 includes an insulating base layer 41, a conductive pattern 42, and an insulating cover layer 43.

The insulating base layer 41 is formed in a flat belt shape extending in the front-rear direction so as to form the outer shape of the flexible wired circuit board 40.

The conductive pattern 42 is formed over the insulating base layer 41. The conductive pattern 42 includes a plurality of (four) terminals 44 and a plurality of (four) wires 45. Note that the conductive pattern 42 also includes terminals at the end portion thereof opposite to the end portion where the plurality of terminals 44 are provided.

Each of the plurality of terminals 44 is disposed on the upper surface of the front end portion of the insulating base layer 41. The plurality of terminals 44 are arranged in parallel to be spaced apart from each other in the widthwise direction. Each of the plurality of terminals 44 includes a main body portion 44A and a protruding portion 44B, similarly to the magnetic head connection terminal 16 in the first embodiment described above.

The main body portion 44A is formed on the upper surface of the insulating base layer 41. The main body portion 44A is formed in a generally rectangular shape (quadrilateral land shape) in plan view extending in the front-rear direction.

The protruding portion 44B is disposed in the front end portion of the terminal 44. The protruding portion 44B protrudes continuously from the widthwise middle of the front end portion of the main body portion 44A to the front side. That is, in the second embodiment, "to the front side" is an example of the protruding direction. The protruding portion 44B is formed in a generally rectangular shape in plan view. A front end portion E3 of the protruding portion 44B protrudes on the front side of a front end edge E4 of the insulating base layer 41. As a result, in bottom view, the front end portion E3 of the protruding portion 44B is exposed from the insulating base layer 3.

Each of the plurality of wires 45 extends rearwardly from the rear end portion of the corresponding terminal 44. The plurality of wires 45 are formed in mutually spaced-apart relation so as to be continued to the terminals which are not shown and provided on the end portion opposite to the end portion where the plurality of terminals 44 are provided.

The insulating cover layer 43 is formed on the upper surface of the insulating base layer 3 so as to cover the peripheral edge portions of the main body portions 44A of the terminals 44 and the wires 45. The insulating cover layer 43 exposes the center portions of the main body portions 44A of the terminal portions 44 and the protruding portions 44B of the terminals 44.

Specifically, the insulating cover layer 43 includes, for each one of the terminals 44, a plurality of (two) first covering portions 43A as an example of the end-portion covering portions, a second covering portion 43B, and a plurality of (two) facing portions 43C, similarly to the insulating cover layer 5 in the first embodiment described above.

Of the insulating cover layer 43, the plurality of first covering portions 43A individually overlap the both widthwise end portions of the main body portion 44A of each of the terminals 44. Each of the plurality of first covering portions 43A extends in the front-rear direction and has a generally rectangular shape in plan view.

Of the insulating cover layer 43, the second covering portion 43B overlaps the rear end portion of the main body portion 44A of the terminal 44. The second covering portion 43B extends in the widthwise direction and has a generally rectangular shape in plan view. The both widthwise end portions of the second covering portion 43B are continued to the respective rear end portions of the plurality of first covering portions 43A.

The plurality of facing portions 43C are arranged on both widthwise outer sides of the protruding portion 44B of the terminal 44 to be spaced apart from each other. The plurality of facing portions 43C are continued from the respective widthwise outer end portions of the front end portions of the first covering portions 43A to extend in the front-rear direction. Each of the plurality of facing portions 43C has a generally rectangular shape in plan view.

The flexible wired circuit board 40 of this type is used in such a case as where, e.g., the flexible wired circuit board 40 is placed between other rigid boards (not shown) each as an example of an electronic component to connect the other rigid boards to each other.

In the second embodiment also, the same function/effect as obtained in the first embodiment described above can be obtained.

Third Embodiment

Referring to FIGS. 8 to 10, a suspension board with circuit 50 as a third embodiment of the present invention is described. Note that, in the third embodiment, the same members as used in the first embodiment described above are designated by the same reference numerals and a description thereof is omitted. Note that, in the third embodiment, the "lower side" corresponds to the "upper side" in the scope of claims.

In the first embodiment described above, the suspension board with circuit 1 on which the slider 32 having the magnetic head 30 is mounted is used. However, the present invention is also applicable to the suspension board with circuit 50 on which not only the slider 32, but also a light source 61 which emits near-field light is mounted.

Figure 10A:
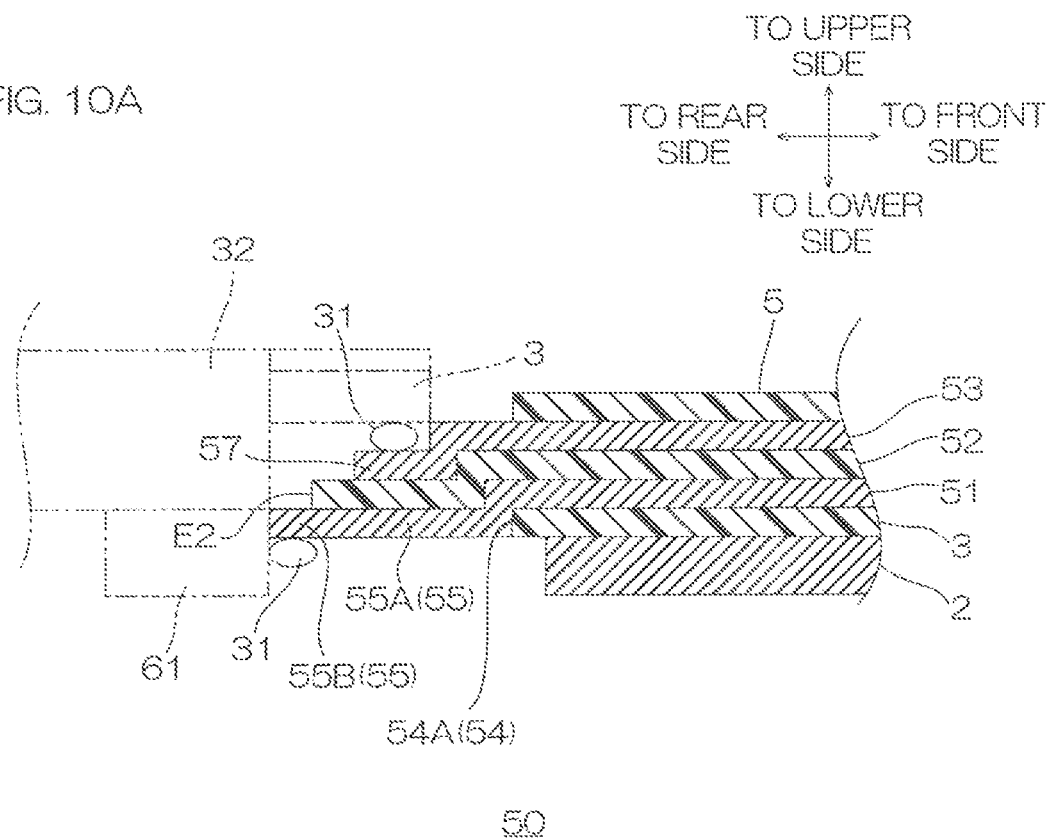
FIG. 10A is a cross-sectional view of the suspension board with circuit shown in FIG. 8 along the line G-G.

As shown in FIGS. 8 and 10A, the suspension board with circuit 50 includes the metal supporting board 2, the insulating base layer 3 as an example of the second insulating layer, a light-source-side conductive pattern 51, an intermediate insulating layer 52 as an example of the first insulating layer, a magnetic-head-side conductive pattern 53, and the insulating cover layer 5.

The metal supporting board 2 is formed in the same manner as in the first embodiment described above.

The insulating base layer 3 is provided on the upper surface of the metal supporting board 2 so as to expose the tongue portion 7 and cover the support frame portion 6 and the wire supporting portion 8. Thus, the insulating base layer 3 covers the front-side half of the opening 9 and exposes the rear-side half thereof. The insulating base layer 3 has a plurality of (four) recessed portions 54.

As shown in FIG. 9, the plurality of recessed portions 54 are disposed in the rear end portion of the insulating base layer 3 over the opening 9 so as to individually overlap a plurality of light source connection terminals 55 (described later) of the light-source-side conductive pattern 51. The plurality of recessed portions 54 are arranged in parallel to be spaced apart from each other in the widthwise direction. Each of the plurality of recessed portions 54 has a first recessed portion 54A and a second recessed portion 54B.

The first recessed portion 54A is disposed in the rear end portion of the recessed portion 54. The first recessed portion 54A is recessed from the rear end edge E2 of the insulating base layer 3 over the opening 9 to the front side. The first recessed portion 54A is formed in a generally rectangular shape in bottom view.

The second recessed portion 54B is recessed continuously from a widthwise generally middle of the first recessed portion 54A to the front side. The second recessed portion 54B is formed in a generally rectangular shape in bottom view.

Figure 10B:
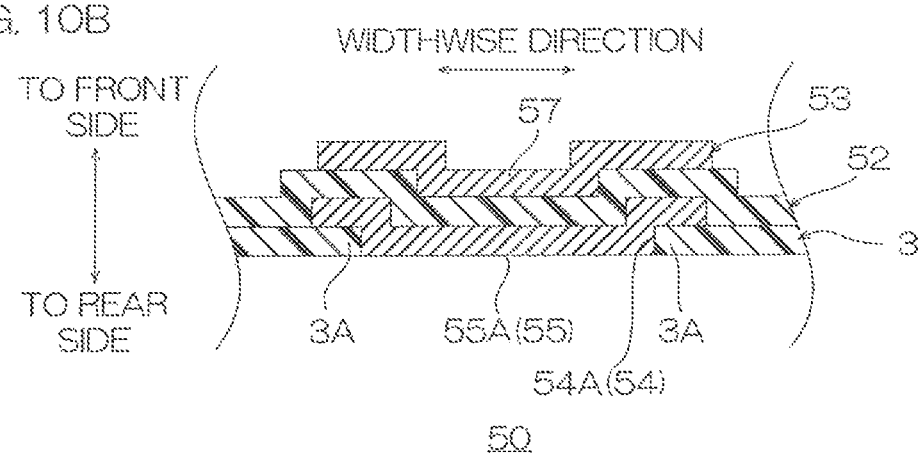
FIG. 10B is a cross-sectional view of the suspension board with circuit shown in FIG. 8 along the line H-H.

As shown in FIGS. 9, 10A, and 10B, the light-source-side conductive pattern 51 is formed on the upper surface of the insulating base layer 3. The light-source-side conductive pattern 51 includes the plurality of (four) light source connection terminals 55 as an example of the terminals and a plurality of (four) wires 56.

As shown in FIGS. 9 and 10A, the plurality of light source connection terminals 55 are disposed on the upper surface of the insulating base layer 3 so as to individually overlap the plurality of recessed portions 54. The plurality of light source connection terminals 55 are arranged in parallel to be spaced from each other in the widthwise direction. Each of the plurality of light source connection terminals 55 includes a main body portion 55A and a protruding portion 55B.

The main body portion 55A is formed on the upper surface of the insulating base layer 3 so as to be embedded in the first recessed portion MA. The main body portion 55A has a generally rectangular shape in plan view extending in the front-rear direction. The both widthwise end portions of the main body portion 55A are disposed on the upper surface of the insulating layer 3 corresponding to the peripheral edge portion on both widthwise sides of the first recessed portion 54A. Note that, in the third embodiment, portions 3A (referred to as the end-portion covering portions 3A in the following description) of the insulating base layer 3 which individually overlap the both widthwise end portions of the main body portion 55A are an example of the end-portion covering portions.

The protruding portion 55B is disposed in the rear end portion of the light source connection terminal 55. The protruding portion 55B protrudes continuously rearwardly from the widthwise middle of the rear end portion of the main body portion 55A so as to be disposed at the widthwise generally middle of the second recessed portion 54B. The both widthwise end edges of the protruding portion 55B are disposed widthwise inwardly of the both widthwise inner surfaces of the second recessed portion 54B to be spaced apart therefrom. The protruding portion 55B has a generally rectangular shape in plan view. Note that, in the third embodiment, portions 3B of the insulating base layer 3 which are disposed on both widthwise sides of the protruding portion 55B are an example of the facing portions.

The plurality of wires 56 are formed in mutually spaced-apart relation to extend from the front end portions of the light source connection terminals 55 over the support frame portion 6 and the wire supporting portion 8 and be continued to the external connection terminals not shown.

The intermediate insulating layer 52 is formed on the upper surface of the insulating base layer 3 so as to cover the light source connection terminals 55 and the wires 56. The intermediate insulating layer 52 has the same shape as that of the insulating base layer 3 except that the intermediate insulating layer 52 does not have the recessed portions 54. That is, a rear end edge E6 of the intermediate insulating layer 52 over the opening 9 corresponds to the rear end edge E2 of the insulating base layer 3 over the opening 9 when projected in the thickness direction. In other words, the rear end edge E6 of the intermediate insulating layer 52 is disposed on the front side of rear end portions E5 of the protruding portions 55B. As a result, the rear end edges E5 of the protruding portions 55B protrude rearwardly from the intermediate insulating layer 52 to be exposed from the insulating base layer 3 and the intermediate insulating layer 52.

The magnetic-head-side conductive pattern 53 is formed on the upper surface of the insulating base layer 3. The magnetic-head-side conductive pattern 53 includes a plurality of (eight) magnetic head connection terminals 57 and a plurality of (eight) wires 58.

As shown in FIGS. 8 and 10A, each of the plurality of magnetic head connection terminals 57 is disposed on the upper surface of the intermediate insulating layer 52 so as to overlap the opening 9 in plan view. The plurality of magnetic head connection terminals 57 are arranged in parallel to be spaced apart from each other in the widthwise direction. Each of the plurality of magnetic head connection terminals 57 has a generally rectangular shape (quadrilateral land shape) in plan view extending in the front-rear direction.

The plurality of wires 58 are formed in mutually spaced-apart relation so as to extend from the respective front end portions of the corresponding magnetic head connection terminals 57 over the support frame portion 6 and the wire supporting portion 8 and be connected to the external connection terminals not shown.

As shown in FIG. 10A, the insulating cover layer 5 is formed on the upper surface of the intermediate insulating layer 52 so as to expose the magnetic head connection terminals 57 and cover the wires 58.

In the third embodiment also, the same function/effect as obtained in the first embodiment described above can be obtained.

Specifically, in the suspension board with circuit 50 in the third embodiment, as shown in FIG. 9, the end-portion covering portions 3A of the insulating base layer 3 overlap the both widthwise end portions of the main body portions 55A of the light source connection terminals 55.

Accordingly, due to the widthwise dimensions of the end-portion covering portions 3A, sufficient widthwise spaces can be ensured between the respective portions of the main body portions 55A of the adjacent light source connection terminals 55 which are exposed from the insulating base layer 3.

As a result, when a solder is melted over the main body portion 55A, the widthwise flow of the excessive solder can be restricted using the end-portion covering portions 3A.

In addition, the solder that has flown toward the protruding portion 55B is received between the protruding portion 16B and the facing portions 5C or adhere to the widthwise side surfaces of the rear end portion E1 of the protruding portion 16B and to the upper surface thereof, in the same manner as in the first embodiment described above.

Thus, in the third embodiment also, the same function/effect as obtained in the first embodiment described above can be obtained.

As shown in FIG. 10B, according to the third embodiment, it is possible to allow the both widthwise end portions of the main body portions 55A of the light source connection terminals 55 to be interposed between the intermediate insulating layer 52 and the insulating base layer 3.

Therefore, it is possible to suppress the peeling of the light source connection terminals 55 off the intermediate insulating layer 52 using the respective portions 3A of the insulating base layer 3 which overlap the both widthwise end portions of the main body portions 55A.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:
1. A wired circuit board, comprising:
a first insulating layer;
a conductive pattern disposed on the first insulating layer and including a plurality of terminals arranged in parallel to be spaced apart from each other and a plurality of wires continued individually to the plurality of terminals; and
a second insulating layer disposed on the first insulating layer so as to cover the conductive pattern, wherein
each of the plurality of terminals includes:
a main body portion continued to the corresponding wire; and
a protruding portion protruding from the main body portion and having a dimension in a parallel arrangement direction in which the plurality of terminals are arranged in parallel which is shorter than a dimension of the main body portion in the parallel arrangement direction,
the second insulating layer includes:
a plurality of end-portion covering portions disposed individually on both end portions of the main body portion in the parallel arrangement direction and exposing a middle portion of the main body portion in the parallel arrangement direction and the protruding portion, and a downstream end surface of the protruding portion in a protruding direction is exposed from the first insulating layer and the second insulating layer.

2. A wired circuit board according to claim 1, wherein the dimension of the protruding portion in the parallel arrangement direction is not more than a space in the parallel arrangement direction between the plurality of end-portion covering portions.

3. A wired circuit board according to claim 1, wherein, in a protruding direction of the protruding portion, a dimension of each of the end-portion covering portions is larger than a dimension of the protruding portion.

4. A wired circuit board according to claim 1, wherein the second insulating layer further includes:
   a plurality of facing portions arranged externally in the parallel arrangement direction of both end portions of the protruding portion in the parallel arrangement direction to be spaced apart from each other.

5. A wired circuit board according to claim 4, wherein a space in the parallel arrangement direction between the plurality of facing portions is larger than a space in the parallel arrangement direction between the plurality of end-portion covering portions.

6. A wired circuit board according to claim 1, wherein a downstream end portion of the protruding portion in the protruding direction thereof protrudes from the first insulating layer.

* * * * *